US006624773B2

(12) United States Patent
Wong

(10) Patent No.: US 6,624,773 B2
(45) Date of Patent: Sep. 23, 2003

(54) DATA ENCRYPTION AND SIGNAL SCRAMBLING USING PROGRAMMABLE DATA CONVERSION ARRAYS

(75) Inventor: Sau C. Wong, Hillsborough, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 10/264,970

(22) Filed: Oct. 4, 2002

(65) Prior Publication Data

US 2003/0034909 A1 Feb. 20, 2003

Related U.S. Application Data

(62) Division of application No. 09/200,500, filed on Nov. 25, 1998.

(51) Int. Cl.[7] .......................... H03M 1/00; G06F 7/38; H03K 19/094; H03K 19/177

(52) U.S. Cl. .......................................... 341/136; 326/44

(58) Field of Search ................................ 341/110, 136; 365/185.03, 185.09, 185.1, 185.11, 185.2, 185.21, 45, 158, 168; 257/220; 326/44

(56) References Cited

U.S. PATENT DOCUMENTS 4,443,660 A 4/1984 DeLong
5,177,786 A 1/1993 Kang
5,477,276 A 12/1995 Oguro
5,521,978 A 5/1996 Oguro
5,745,409 A * 4/1998 Wong et al. ........... 365/185.03
5,748,124 A 5/1998 Rosenthal et al.
6,072,872 A 6/2000 Chang et al.
6,078,666 A 6/2000 Murakami
6,154,157 A * 11/2000 Wong ......................... 341/110
6,169,503 B1 * 1/2001 Wong ......................... 341/136
6,259,627 B1 * 7/2001 Wong .................... 365/185.21

OTHER PUBLICATIONS

Schneier, Bruce, Applied Cryptography, $2^{nd}$ ed. pp. 3 and 357–360.

* cited by examiner

*Primary Examiner*—Patrick Wamsley
(74) *Attorney, Agent, or Firm*—Parsons Hsue & de Runtz LLP

(57) ABSTRACT

A scrambling or encryption method involves analog-to-digital, digital-to-analog, analog-to-analog or digital-to-digital conversions that are constructed from one or more analog-to-digital or digital-to-analog conversions. For example, encryption of an analog signal converts the analog signal to an intermediate digital signal that is converted back into a scrambled analog signal. Encryption of a digital signal converts the digital signal to an intermediate analog signal that is converted back into an encrypted digital signal. The conversions between analog form and digital form and back can be repeated. A codec scrambling/descrambling and encryption/decryption implements one or more different analog-to-digital conversions and one or more digital-to-analog conversions. One embodiment of the codec includes a programmable conversion array that includes an array of transistors such as floating gate transistors in memory cells. Input circuitry applies an analog signal to gates of the transistors during an analog-to-digital conversion, and an encoder that generates an output digital value according to which transistor or transistors conduct while the analog signal is applied. For digital-to-analog conversion, a read circuit reads the threshold voltage of a transistor identified by a selected digital value to generate an analog voltage that is corresponds to the selected digital value. A selection circuit for the converter can route the digital output signal from the encoder to select a transistor to be read and route the analog output signal from the read circuit to the input circuitry. Accordingly, output values can be routed through the converter multiple times.

8 Claims, 5 Drawing Sheets

DATA ENCRYPTION AND SIGNAL SCRAMBLING USING PROGRAMMABLE DATA CONVERSION ARRAYS

CROSS REFERENCE TO RELATED APPLICATION

This application is a divisional of U.S. patent application Ser. No. 09/200,500, entitled "DATA ENCRYPTION AND SIGNAL SCRAMBLING USING PROGRAMMABLE DATA CONVERSION ARRAYS", filed Nov. 25, 1998. This application relates to commonly-owned U.S. patent application Ser. No. 09/159,704, entitled "PROGRAMMABLE DATA CONVERSION ARRAYS", filed Sep. 23, 1998, now U.S. Pat. No. 6,169,503, and U.S. patent application Ser. No. 09/200,205, entitled "NON-LINEAR MAPPING OF THRESHOLD VOLTAGES FOR ANALOG/MULTI-LEVEL MEMORY", filed concurrently, now U.S. Pat. No. 6,154,157, both of which are incorporated in their entirety.

BACKGROUND

1. Field of the Invention

This invention relates to circuits and methods for employing non-volatile memory to transform digital and analog signals and to circuits and methods for encrypting or scrambling and decrypting or descrambling digital and analog signals.

2. Description of Related Art

Limiting access to confidential or proprietary information is critical to maintain the privacy or commercial value of the information. Accordingly, many systems have been developed to prevent unauthorized use of information. For example, smart cards, which are in worldwide use, include integrated circuits that contain financial information and require security systems to limit access or use of the information. Commercial television broadcast systems often transmit signals via cable or air waves for the use of those paying for the transmission but also want to prevent others from using the transmission. Communications via the internet, radio, cellular telephones, and telephone lines have a variety of security concern that arise from possible unauthorized interception and use of transmitted information. Accordingly, users often want to protect their communications from unauthorized interception.

A common method for protecting confidential information is to encrypt data or scramble signals that convey the information. Ideally, the encrypted data or scrambled signals convey no usable information to unauthorized recipients, but authorized recipients having the appropriate facility to convert the encrypted data or scrambled signals can decode and use the information. Sometimes the conversion facility consists of a password or key and appropriate software and/or hardware for converting encrypted data or scrambled signal to a usable form. To improve security, the facility of converting the protected information should be difficult or impossible to reverse engineer or duplicate without authorization.

SUMMARY

In accordance with the invention, a scrambling or encryption method involves analog-to-digital, digital-to-analog, analog-to-analog, or digital-to-digital conversions that are constructed from one or more conversions, each conversion including an analog-to-digital conversion or a digital-to-analog conversion. Specifically, encryption of an analog signal converts the analog signal to an encrypted digital signal that can be transmitted or converted into an encrypted analog signal. Encryption of a digital signal converts the digital signal to an encrypted analog signal that can be transmitted or converted into an encrypted digital signal. The conversions between analog form and digital form and back can be repeated as many times as desired until a desired encrypted signal is ready and transmitted. Performing the inverse conversions in reverse order reconstructs the original analog signal.

A codec for scrambling/descrambling and encryption/decryption implements two or more different analog-to-digital conversions and two or more digital-to-analog conversions. One embodiment of the codec includes a programmable data conversion array that includes an array of transistors such as floating gate transistors in memory cells. Input circuitry applies an analog signal to gates of the transistors during an analog-to-digital conversion, and an encoder that generates an output digital value according to which transistor or transistors along a row line conduct while the analog signal is applied to the row line. For a digital-to-analog conversion, a read circuit reads the threshold voltage of a transistor identified by a selected digital value to generate an analog voltage that corresponds to the selected digital value. A selection circuit for the converter can route the digital output signal from the encoder to select a transistor to be read and can route the analog output signal from the read circuit to the input circuitry. Accordingly, output values can be routed through the converter once or multiple times.

In accordance with one embodiment of the invention, a converter for a scrambling or encryption system includes an array of transistors such as floating gate transistors and an analog read circuit coupled to the array during a first operation, e.g., a digital-to-analog conversion. The analog read circuit has an output terminal for an analog output signal representing a threshold voltage of a transistor identified by a selected digital signal during the first operation. A first select circuit selects a gate bias signal, selects a set of transistors in the array, and applies the selected gate bias signal to gates of transistors in the selected set. During a second operation, e.g., an analog-to-digital conversion, the first select circuit selects the analog output signal or an analog input signal as the selected gate bias signal. An encoder coupled to the array generates a multibit digital output signal that represents a digital output value that depends on which transistor or transistors in the selected set conduct during the second operation. A second select circuit generates the selected address signal, the selected address signal being dependent on the digital output signal or the digital input signal. In an exemplary embodiment, the first select circuit includes a row decode for the array and multiplexers for selecting the row bias signal, and the second select circuit includes a column decoder and mixing circuits that generate the address signal. The array typically includes multiple sets of transistors, each having a different sequence of threshold voltages that defines an analog-to-digital conversion and a digital-to-analog conversion that is the inverse of the analog-to-digital conversion. Each encryption involving two or more passes through the array requires at least two different sets of transistors that define different conversions.

One method for scrambling an analog signal or encrypting a digital signal includes converting the signal (analog or digital) to an intermediate signal of the opposite form using a first conversion and converting the intermediate signal back using a second conversion that is not the inverse of the first conversion. Since the second conversion is not the inverse of the first conversion, the resulting signal is an encoded (i.e., scrambled or encrypted) signal. The encoded signal can be transmitted to a receiver for decoding (i.e., descrambling or decryption.) In the decoding process, the receiver converts the encoded signal to an intermediate signal using a third conversion and converts that intermediate signal to a decoded signal using a fourth conversion. The third conversion is the inverse of the second conversion, and the fourth conversion is the inverse of the first conversion. The decoding may include decoding a key to identify which of a plurality of analog-to-digital conversions and a plurality of digital-to-analog conversions are the third and fourth conversions.

A more complex process for encrypting an analog signal includes: (a) selecting the analog signal as an input analog signal; (b) selecting an analog-to-digital conversion from a plurality of analog-to-digital conversions; (c) converting the input analog signal to an intermediate digital signal using the analog-to-digital conversion last selected in step (b); (d) selecting a digital-to-analog conversion from a plurality of digital-to-analog conversions; and (e) converting the intermediate digital signal into a scrambled analog signal using the digital-to-analog conversion last selected in step (d). Steps (b) through (f) can be repeated one or more times, each time selecting the scrambled analog signal as the input analog signal. A decryption process selects an analog-to-digital conversion from the plurality of analog-to-digital conversions, converts a received input signal to an intermediate digital signal using the analog-to-digital conversion last selected, selects a digital-to-analog conversion from the plurality of digital-to-analog conversions, and converts the intermediate digital signal into an intermediate analog signal using the digital-to-analog conversion last selected. Paired conversions, each including a digital-to-analog conversion and an analog-to-digital conversion, are repeated as in the encryption method. A key or password can identify conversions selected for either coding or decoding.

Encryption and decryption processes for digital signals can be performed in a similar fashion except the encryption and decryption processes select and use digital-to-analog conversions in place of analog-to-digital conversions and selects and uses analog-to-digital conversions in place of digital-to-analog conversions.

Using conversion arrays with floating gate transistors that are programmed for the required conversions makes reverse engineering of encoders or decoders very difficult because information critical to the encryption or decryption process depends on the charges on floating gates. Disassembling a converter would disturb the charge making charge measurement difficult or impossible. Further, since the encryption and decryption processes can be implemented using erasable and programmable memory cells, conversions and the associated encryption and decryption processes can be change if necessary. For example, encoders and decoders can be changed or up-dated on-the-fly and from a remote location. This adds additional levels of security.

BRIEF DESCRIPTION OF THE DRAWINGS

Use of the same reference symbols in different figures indicates similar or identical items.

DETAILED DESCRIPTION OF THE PREFERRED EMBODIMENTS

Figure 1:
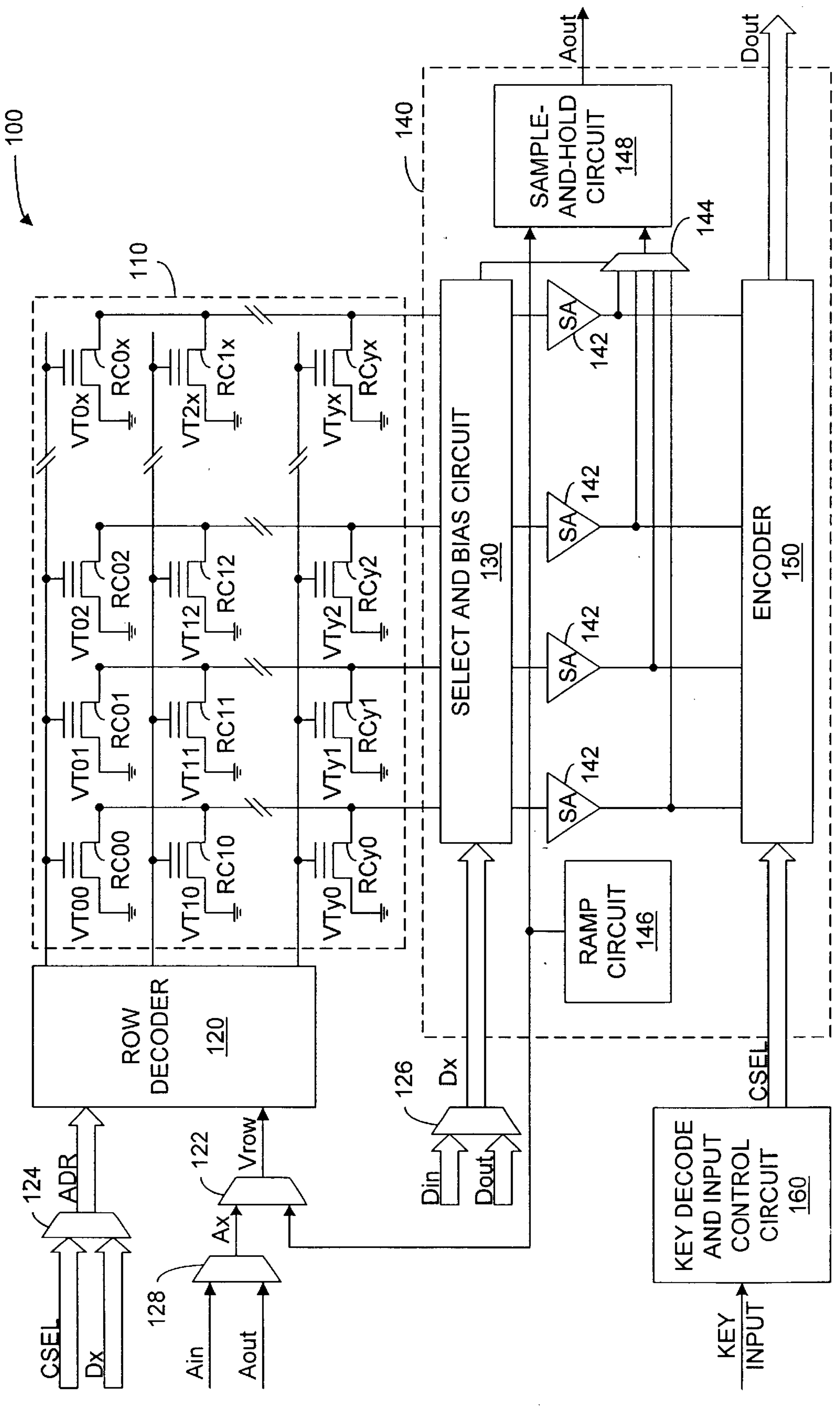
FIG. 1 shows a block diagram of a converter for a security system in accordance with an embodiment of the invention.

In accordance with an embodiment of the invention, a security system includes a programmable converter that converts an original digital or analog input signal to an encoded digital or analog output signal and converts an encoded signal back to the original signal. The converter includes a non-volatile memory array (sometimes referred to herein as a conversion array) that provides programmable references for signal conversions and implements more than one type of analog-to-digital conversions and more than none type of digital-to-analog conversions. Generally, each analog-to-digital conversion is the inverse of a corresponding digital-to-analog conversion. The conversion array, being programmable, allows a user or manufacturer to select or change the conversions implemented in the converter to programmably select the encoding and decoding implemented. In particular, an information provider can program the conversion array for conversions unique to the information provider's system, and provide the converters to authorized users. The converter being custom programmed prevents others, even those having physically identical but differently programmed converters, from being able to decode or encoded information. The converter may additionally require a password or key that selects from among variety of programmed conversions or combinations of programmed conversions. Accordingly, even with an appropriately programmed converter, a user is unable to convert encoded information unless the user knows the appropriate password or key.

In accordance with an aspect of the invention, an encoder employs an analog-to-digital or a digital-to-analog conversion to convert an analog or digital signal to an encoded signal of the opposite type. A programmable data conversion array can perform a conversion that depends on the programming of the array. A decoder contains an identically programmed data conversion array that decrypts the encrypted signal and converts the signal back to its original form.

In accordance with another aspect of the invention, the security system and converter can encode or decode digital or analog signals where the encrypted signal is of the same form as the original signal. In particular, encoding an analog signal as an encrypted or scrambled analog signal converts the analog signal to an intermediate digital signal and converts the intermediate digital signal to the encrypted analog signal. The two conversions are not the inverses of each other so that the resulting output analog signal differs from the input analog signal in a manner that depends of the programming of the two conversions. If desired, different even numbers of sequential conversions through the converter to provide a variety of different encodings of the original analog signal, and a key or password can select the sequence of conversions. Since repeated conversions periodically fix the signal in digital format, analog drift or analog error does not propagate from one conversion to the next unless an analog error in a single conversion rises to the significance of a full bit. Decoding performs, in reverse order, the inverse of each conversion performed during encoding. Digital signals are similarly encoded as encrypted digital signals by performing digital-to-analog and analog-to-digital conversions.

U.S. patent application Ser. No. 09/159,704, "Programmable Data Conversion Arrays," filed Sep. 23, 1998 describes converters suitable for security systems in accordance with embodiments of the present invention and is hereby incorporated by reference in its entirety.

FIG. 1 illustrates a combined analog-to-digital and digital-to-analog converter (ADDAC) 100 having input ports for an analog input signal Ain and a digital input signal Din and output ports for an analog output signal Aout and a digital output signal Dout. ADDAC 100 also includes a multiplexer 128 that selects either analog input signal Ain or analog output signal Aout to provide an analog value Ax for conversion to digital form. A multiplexer 126 selects either digital input signal Din or digital output signal Dout to provide a digital value Dx for conversion to analog form. Thus, ADDAC 100 can convert analog input signal Ain into digital output signal Dout during a first conversion and convert signal Dout from the first conversion to analog signal Aout during a second conversion. The net result is an analog-to-analog conversion of signal Ain to signal Aout. Similarly, ADDAC 100 can convert digital input signal Din into analog output signal Aout during a first conversion and convert signal Aout of the first conversion to digital output signal Dout during a second conversion, with the net result being a digital-to-digital conversion of signal Din to signal Dout.

To perform the conversions, ADDAC 100 includes a conversion array 110, input circuits, and output circuits 140. Array 110 includes rows 0 to y of reference cells RC00 . . . RC0x, RC10 . . . RC1x, . . . , RCy0 . . . RCyx. In array 110, each reference cell RC00 to RCyx is a floating gate transistor having a programmable threshold voltage VT00 to VTyx, and each row 0 to y has a row line that connects to the control gates of all the memory cells in the row. Alternatively, array 110 can include any type of memory cell that includes a transistor having a programmable threshold voltage that can be changed during or after manufacture of the converter and read during operation of the converter. Reference cells RC00 to RCyx are arranged in x+1 columns 0 to x of reference cells RC00 . . . RCy0, RC01 . . . RCy1, . . . , RC0x . . . RCyx, where reference cells in a column have their drains coupled together by a column line corresponding to the column. In FIG. 1, the sources of all of reference cells RC00 to RCyx are grounded, but alternatively, one or more source lines can connect the sources of reference cells RC00 to RCyx to erase circuits.

As described further below, reference cells RC00 to RCxy have respective threshold voltages programmed to provide multiple distinct conversion. The programming can be performed during manufacture of ADDAC using integrated circuit processing techniques to set the threshold voltages in the memory cells (e.g., by a channel threshold voltage ion-implantation masks for ROM) or using off-chip programming circuits. Alternatively or additionally, the ADDAC may contain on-chip erase or programming circuits (not shown) that can change or set the threshold voltages at any time. Programming circuits and methods for programming non-volatile memory cells such as reference cells RC00 to RCyx are well known. In an exemplary embodiment of ADDAC 100, each row 0 to y in array 110 is associated with a different conversion between analog and digital signals, and memory cells in a row have threshold voltages programmed to levels that define the conversion for the row. For example, threshold voltages VT0 to VTx in a row, may define a linear conversion. Specifically, if analog value Ax is in a voltage range from Vmin to Vmax, the threshold voltage VTi for i from 0 to x as given in Equation 1 provides linear analog-to-digital and digital-to-analog conversions.

$$VTi=i*(Vmax-Vmin)/x+Vmin \qquad \text{Equation 1}$$

Threshold voltages VTi according to Equation 2 implement a conversion where analog value Ax is in the voltage range from Vmin to Vmax and the value that signal Dout represents is equal to a function F of the voltage of signal Ax.

$$VTi=F(i*(Vmax-Vmin)/x+\mathrm{Vmin}) \qquad \text{Equation 2}$$

Generally, over its range, function F should have a single-valued inverse for an invertable analog-to-digital conversion. The number of suitable functions and conversions definable in this manner is practically limitless.

A row decoder 120 selects from array 110 a row identified by an address signal ADR and applies a signal Vrow from a multiplexer 122 to the selected row. Multiplexer 122 provides analog value Ax as signal Vrow during an analog-to-digital conversion and provides a signal Vramp from a ramp circuit 146 during a digital-to-analog conversion. To perform an analog-to-digital conversion, row decoder 120 applies analog voltage Ax to the row line corresponding to the selected conversion and biases unselected row lines to a voltage lower than the threshold voltage of any reference cell RC00 to RCyx in array 110. Accordingly, none of the reference cells coupled to unselected row lines conduct, but the reference cells that are in the selected row and have threshold voltages less than voltage value Ax conduct. A bias circuit 130 biases all of the column lines of array 110 to a positive voltage (typically 1 to 1.5 volts), and sense amplifiers 142 sense which of the column lines of array 110 couple to conductive reference cells. Each sense amplifier 142 asserts a binary signal indicating whether an associated reference cell in the selected row conducts, and an encoder 150 generates an output digital signal Dout from the binary signals. In an exemplary embodiment, encoder 150 is a thermometer-to-binary encoder that gives signal Dout a value indicating which column or columns in array 110 contain conductive reference cells.

To perform a digital-to-analog conversion, multiplexer 122 selects signal Vramp from ramp circuit 146, and row decoder 120 applies signal Vramp to the row line that address signal ADR selects. Again, row decoder 120 biases unselected row lines to a voltage lower than the threshold voltage of any reference cell RC00 to RCyx in array 110 so that none of the reference cells coupled to unselected row lines conduct. Ramp circuit 146 sweeps signal Vramp across the range of threshold voltages permitted for reference cells RC00 to RCyx, and each reference cell changes conductivity state when signal Vramp reaches the threshold voltage of the reference cell. Selection and bias circuit 130 biases to a positive voltage, at least a selected column line that has a column address associated with digital value Dx, and the associated sense amplifier 142 senses whether the selected column line is coupled to a conductive reference cell. Bias circuit 130 could simultaneously bias all column lines at the positive voltage, but to save power, bias circuit 130 biases only the column line having the column address that signal Dx indicates. A multiplexer 144 selects the one of sense amplifiers 142 that is coupled to the column line having the column address that signal Dx identifies and provides the binary signal from the selected sense amplifier 142 as a trigger signal for sample-and-hold circuit 148. When the conductivity state of the reference cell in the selected row and the selected column changes, sample-and-hold circuit 148 samples voltage Vramp from ramp circuit 146 and gives analog output signal Aout the sampled voltage level.

In an alternative embodiment of ADDAC 100, multiple rows of array 110 contain reference cells for a single conversion. Using multiple rows for a conversion allows higher resolution analog signals and more bits in digital signals. In particular, an n-bit conversion requires about $2^n$ reference cells, but if each row contains fewer than $2^n$ cells, multiple rows of array 110 can be used for each conversion. When each conversion requires multiple rows, a mixer 124 combines digital value Dx and signal CSEL to determine the row address of the selected row for a digital-to-analog conversion. Specifically, signal CSEL selects the conversion (i.e., a set of rows corresponding to the conversion), and the most significant bits of digital input signal Dx select which row from the set contains the reference cell corresponding to value Dx. Accordingly, as shown in FIG. 1, mixer 124 gives address signal ADR most significant bits from signal CSEL and least significant bits from most significant part of signal Dx. The least significant part of digital input signal Dx selects which column of array 110 output circuit 140 reads to provide analog output signal Aout.

For an analog-to-digital conversion using multiple rows per conversion, signal CSEL has a value that selects one of the rows associated with a desired conversion, and output circuit 140 determines the conductivity states of the reference cells in the current row. If all of the reference cells in the current row conduct or do not conduct, control circuitry (not shown) changes signal CSEL to select another row corresponding to the desired conversion. The control circuit continues to change signal CSEL until a row is found in which some reference cells conduct and other reference cells do not conduct or until two rows that are consecutive in the conversion, are found where one row contains only conducting reference cells and the other row contains only non-conducting reference cells. Once signal CSEL settles on the appropriate row, encoder 150 determines digital output signal Dout based on signal CSEL and on which reference cells in the selected row conduct. In particular, signal CSEL, which identifies the selected row, indicates the most significant bits of signal Dout, and the conducting reference cells in the selected row indicate the least significant bits of signal Dout.

Although FIG. 1 shows a specific embodiment of output circuit 140, output circuit 140 can contain other types of read circuits that are capable of determining a threshold voltage. U.S. patent Ser. No. 5,751,635, entitled "Read Circuits for Analog Memory Cells"; U.S. patent Ser. No. 5,748,534, entitled "Feedback Loop for Reading Threshold Voltages"; U.S. patent Ser. No. 5,748,533, entitled "Read Circuit which Uses a Coarse-to-Fine Search when Reading the Threshold Voltage of a Memory Cell"; and U.S. patent application Ser. No. 09/053716, entitled "High Resolution Multi-Bit-Per-Cell Memory", filed Apr. 1, 1998 describe some other suitable read circuits and are hereby incorporated by reference in their entirety.

Figure 2:
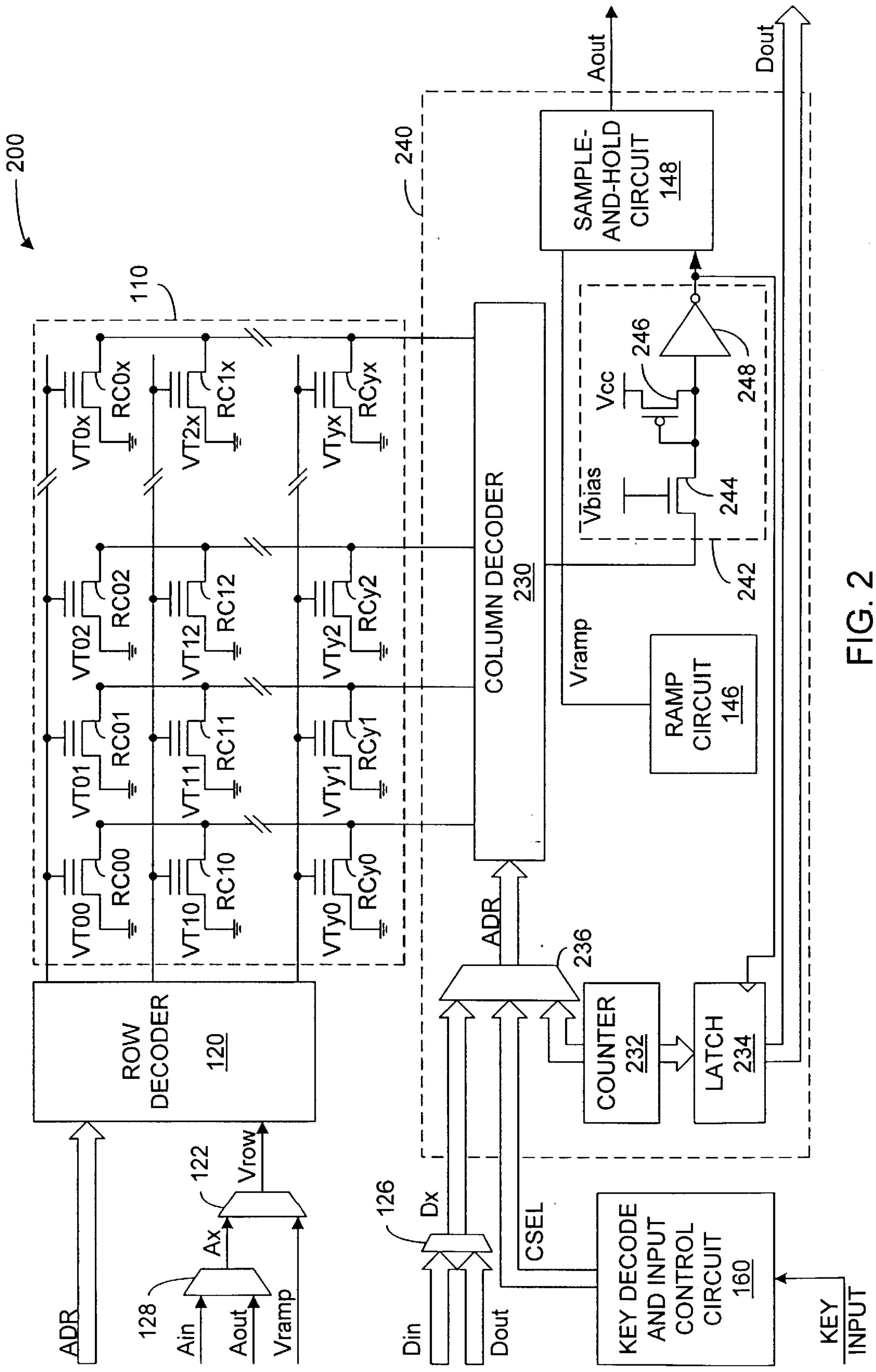
FIG. 2 shows a block diagram of a converter for a security system in accordance with another embodiment of the invention.

FIG. 2 illustrates an ADDAC 200 which is similar to ADDAC 100 but has a output circuit 240 including a single sense circuit 242, a counter 232, and a latch 234. As above, signal CSEL identifies the first or only row associated with the conversion being perform. During an analog-to-digital conversion, multiplexer 122 and row decoder 120 apply analog signal Ax to a selected row line while counter 232 increments through the possible digital values for signal Dout. For each time counter 232 increments the count, a column decoder 230 selects another column line of array 110 and connects sense circuit 242 to the selected column line. Circuit 242 biases the selected column line and senses whether the reference cell in the selected row and selected column conducts. A mixer 236 generates and applies an address signal ADR to row decoder 120 and a column decoder 230 to sequentially select reference cells corresponding to the conversion. If multiple rows of array 110 represent a single conversion, row decoder 120 changes the selected row line to which analog signal Ax is applied after a column address to column decoder 230 reaches the end of a row. At the dividing point between conductive and non-conductive reference cells, latch 144 registers the count from counter 232 and holds that count as digital output signal Dout.

During a digital-to-analog conversion, signal CSEL again identifies the rows corresponding to a conversion, and digital signal Dx identifies a reference cell that corresponds to the digital value being converted. Accordingly, address signal ADR from mixer 236 is a combination of signals Dx and CSEL that selects the reference cell from the set of rows that signal CSEL identifies. Column decoder 150 connects that reference cell to sense circuit 242 which triggers sample-and-hold circuit 148 when required to provide analog output signal Aout at the level of the threshold voltage of the target reference cell.

For an analog-to-analog conversion, ADDAC 100 or 200 performs at least two conversions, an analog-to-digital conversion and a digital-to-analog conversion. For the analog-to-digital conversion, signal CSEL selects a set of reference cells defining the conversion, and multiplexers 122 and 128 select analog input signal Ain for conversion. ADDAC 100 or 200 converts analog input signal Ain to digital output signal Dout. For the digital-to-analog conversion, signal CSEL changes to select a set of reference that defines a different conversion, and multiplexer 126 selects signal Dout from the first conversion to provide value Dx for conversion. A different conversion is selected because if the same conversion, e.g., the same row of array 110 were used, the digital-to-analog conversion would simply invert the analog-to-digital conversion so that analog output signal Aout is equal to analog input signal Ain. However, if the two conversions differ, the result of the two conversions can complete any desired mapping of voltages of analog input signal Ain to voltages of analog output signal Aout. In one example application, the analog-to-digital conversion uses reference cells having threshold voltages as in Equation 2 where the value that signal Dout represents is a non-linear function F of the voltage of signal Ain, and the digital-to-analog conversion defines a linear mapping of the value that signal Dout to the voltage of signal Aout. As a result of this combination, signal Aout is equal to F(Ain). As indicated above, proper selection of the threshold voltages in a row can define any function F.

In the exemplary embodiment, signal CSEL selects one row of array 110 for the analog-to-digital conversion and a different row for the digital-to-analog conversion. A user can provide a password or a key that indicates the rows of array 110 for the first and second conversions. Key decode and control input circuit 160 decodes the key and generates signal CSEL to select the appropriate conversions. Additionally, circuit 160 controls input multiplexers 122, 126, and 128 to loop the output from the first conversion back through the conversion array. Further, since the result of the two conversions is an analog signal Aout, that signal can undergo one or more additional analog-to-analog conversions where the password or key selects the number and nature of the conversions used in encoding. Decoding of the resultant analog signal is an analog-to-analog conversion that inverts each of the conversions conducted during encoding. For example, if an encoding used a first row of array 110 for a first analog-to-digital conversion, a second row of array 110 for a first digital-to-analog conversion, a third row of array 110 for a second analog-to-digital conversion, and a fourth row of array 110 for a second digital-to-analog conversion, decoding uses the fourth row of array 110 for an analog-to-digital conversion, the third row of array 110 for a digital-to-analog conversion, the second row of array for another analog-to-digital conversion, and the first row of array 110 for the final digital-to-analog conversion.

ADDAC 100 or 200 performs a digital-to-digital conversion by performing a digital-to-analog conversion on digital input signal Din and performing an analog-to-digital conversion on signal Aout. As above, the digital-to-analog conversion and the analog-to-digital conversion use different sets of reference cells so that the analog-to-digital conversion does not simply invert the digital-to-analog conversion. Again, digital-to-digital conversions can be sequentially performed and selected in number and nature according to a password or key provided to circuit 160.

Security systems based on ADDAC 100 and 200 have a number of advantages. In particular, array 110 being programmable allows a manufacturer to program array 110 specifically for a particular application so that identical circuits programmed for other applications are unable to decode coded information. Further, reverse engineering a device to determine the encoding is difficult because the decoding performed depends on electric charge on floating gates. Tampering with such memory cells tends to disturb the charge and make measurement of programmed threshold voltages difficult or impossible. Further, the speed of the conversions depends on the time required to read memory cells, which is typically less than about 1 $\mu$s. Accordingly, the converter can handle high digital data rates or equivalently high sampling rates for analog signals being converted.

Figure 3:
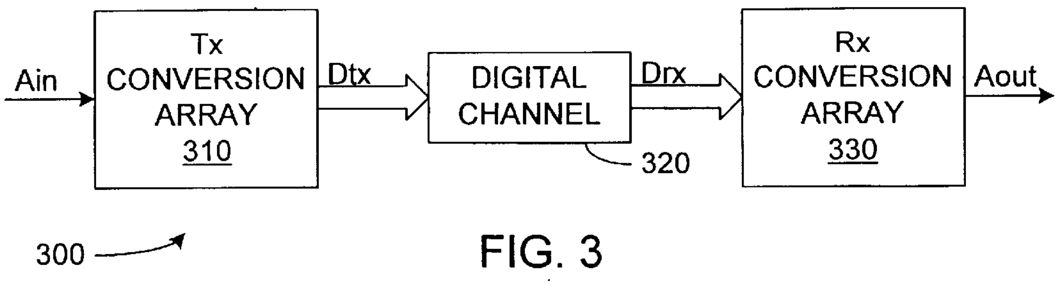
FIG. 3 is a block diagram of a system for encoding of an analog signal to an encrypted digital signal and decoding the encrypted digital signal to recover the analog signal.

FIG. 3 illustrates a security system 300 for encrypting or scrambling an analog signal Ain and transmitting an encrypted signal Dtx over a digital channel 320. Security system includes a conversion array 310 on the transmitter side of digital channel 320 and a conversion array 330 on the receiver side of channel 320. Each conversion array 310 and 330 can be an ADDAC such as converters 100 and 200 described above. Alternatively, conversion array 310 can be an analog-to-digital conversion array or a conventional ADC, and conversion array 330 can be a digital-to-analog conversion array or a conventional DAC. In an example application, analog input signal Ain is an audio or video signal that is sampled at a suitable sampling frequency. Conversion array 310 converts each analog sample of signal Ain to a digital value using a specific conversion programmed into array 310. Conversion may require a single pass through conversion array 310 or any odd number of passes if array 310 is capable of both analog-to-digital and digital-to-analog conversions. Since analog signals such as audio signals are relatively error tolerant, conversion array 310 can provide a relatively large number of bits (8 or more) even if the large number of bits include an occasional bit error.

Optionally, data compression can compress a digital data stream from conversion array 310 to reduce the bandwidth required for transmission of signal Dtx on digital channel 320. Digital channel 320 is, for example, an ISDN telephone line, a pair of modems connected via an analog telephone line, or some more complicated system such as the internet which is capable of conveying digital information. Conversion array 330 receives encrypted digital signal Drx and converts signal Drx to a decoded analog signal Aout. To perform the appropriate inverse conversion, conversion array 330 programmed the same as conversion array 310. A matching key may also be required for receiver to identify the appropriate conversion. Example applications of the system of FIG. 3 include more secure telephone communications via digital channels and a system where the transmitter sends signals intended for decoding paying subscribers only.

Figure 4:
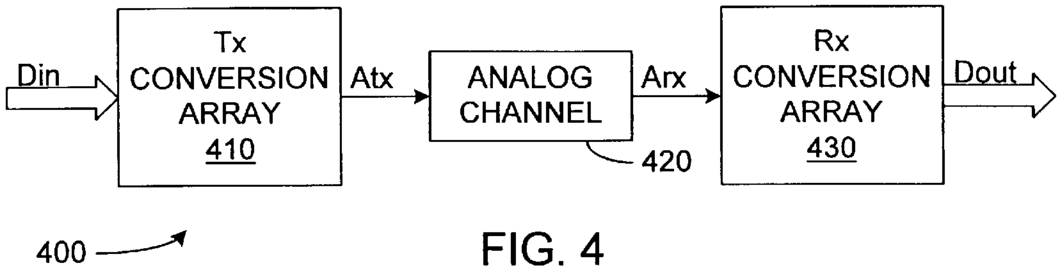
FIG. 4 is a block diagram of a system for encoding of a digital signal as an scrambled analog signal and decoding the scrambled digital signal to recover the original digital signal.

FIG. 4 illustrates a system 400 for encrypting or encoding a digital signal Din as an analog signal Atx, transmitting an encrypted signal Atx over an analog channel 420. A conversion array 410 on the transmitter side converts the digital signal to an analog signal, and a conversion array 330 on the receiver side converts a received analog signal Arx to a digital signal Dout. Analog channel 420 can be a single line such as a telephone. If analog channel 420 is capable of carrying transmitted analog signal Atx without change, conversion array 430 would be programmed exactly as conversion array 410 so that conversion array 430 performs the inverse of the conversion that array 410 performs. However, if channel 420 distorts, attenuates, or otherwise changes the transmitted signal so that received signal Arx differs from transmitted signal Atx, conversion array 430 can be programmed differently from conversion array 410 in an attempt to compensate for the changes in channel 420. Additionally, conversion array 430 can implement a set of different conversions where the conversion used for a particular sample depends on the characteristics of channel 420, previous samples of signal Arx, and/or previous converted values Dout. Conversion array 430 can thus perform a combination decoding or decrypting and filtering of signal Arx. If the conversions are appropriately programmed, the selection of a conversion for a sample of signal Arx based on N previous samples of signal Arx can implement an N-tap finite impulse response (FIR) filter. Using values of converted signal Dout to select the conversion, conversion array 430 can implement an infinite impulse response (IIR) filter.

Conversion array 430 can also be programmed for filtering of an analog signal that is not encrypted. Such filtering is common in modems which convert a received analog signal to samples that are digitally filtered and demodulated to extract data. A modem can use conversion array 430 to perform initial filtering of an analog input signal.

Figure 5:
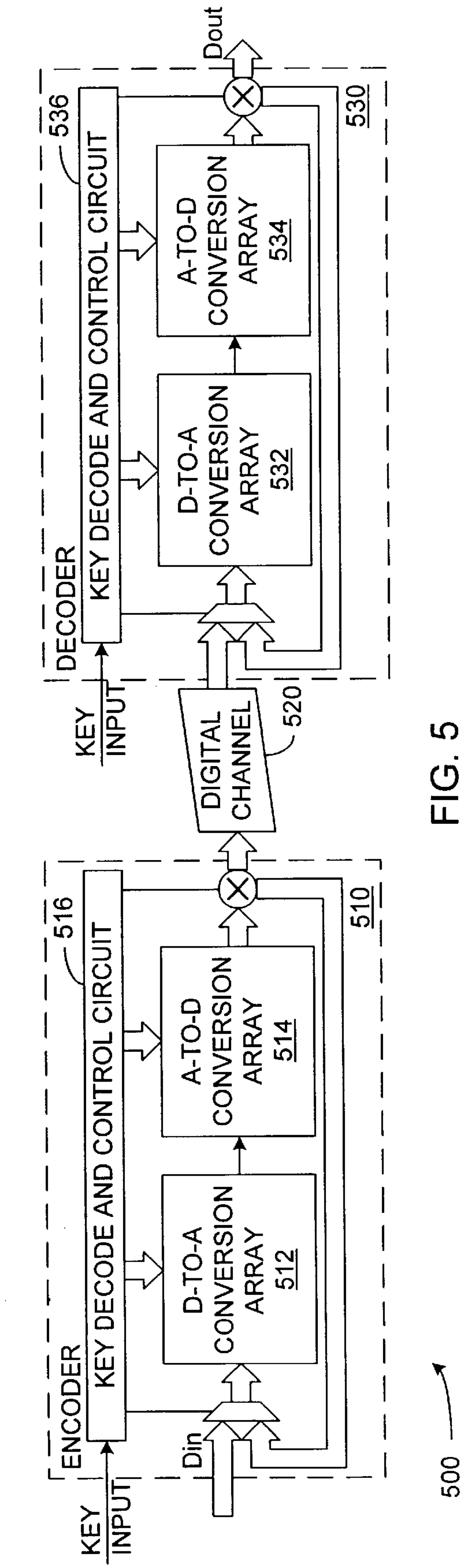
FIG. 5 is a block diagram of a system for encoding of a digital signal as an encrypted digital signal and decoding the encrypted digital signal to recover the original digital signal.
Figure 6:
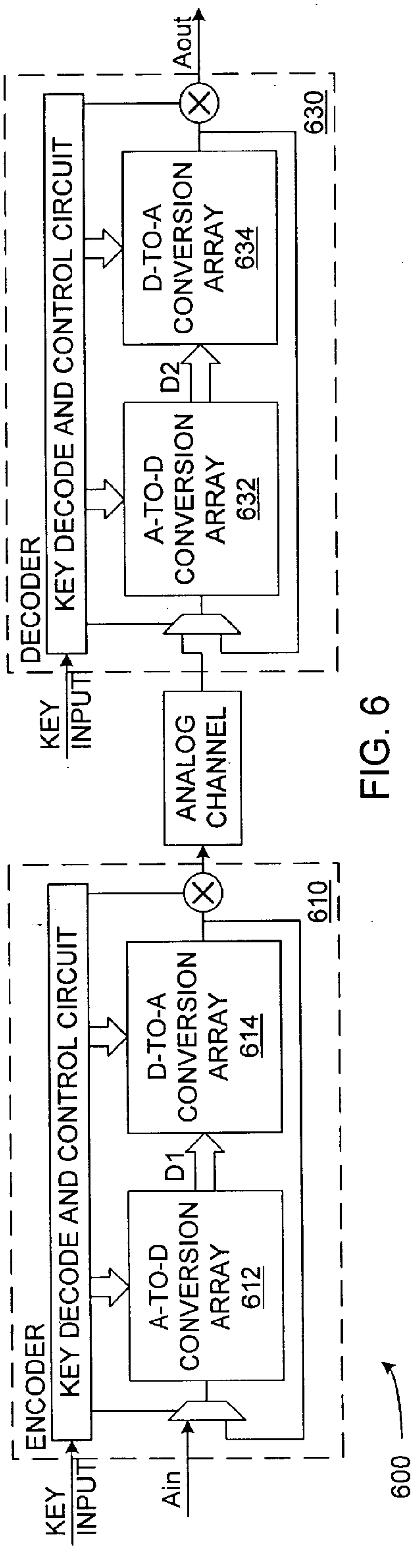
FIG. 6 is a block diagram of a system for encoding of an analog signal as an scrambled analog signal and decoding the scrambled analog signal to recover the original analog signal.

FIGS. 5 and 6 show systems 500 and 600 respectively for digital-to-digital and analog-to-analog encryption and decryption. In accordance embodiments of the invention shown in FIGS. 5 and 6, digital-to-digital and analog-to-analog conversions are constructed from pairs of conversions. System 500 has an encoder 510 including two conversion arrays 512 and 514. Conversion array 512 performs digital-to-analog conversions, and conversion array 514 performs analog-to-digital conversions. Using two conversion arrays 512 and 514 allows twice the data rate of a single array converter performing digital-to-digital conversions because array 514 can start converting an analog value from array 512 when array 512 begins converting a new digital sample. A key decode and control circuit 516 selects the specific converters that each of converters 512 and 514 perform and selects whether the digital output signal from conversion array 514 is transmitted on digital channel 520 or routed back to conversion array 512 for another pair of conversions. A decoder 530 at a receiver side of digital channel 520 also includes two conversion arrays 532 and 534 and a key decode and control circuit 536. Conversion array 532 performs digital-to-analog conversions that are inverses of the analog-to-digital conversions that conversion array 514 performs. Conversion array 534 performs analog-to-digital conversions that are inverses of the digital-to-analog conversions that conversion array 512 performs. Accordingly, the programming of array 532 is the same as the programming of array 514, and the programming of array 534 is the same as the programming of array 512. System 600 (FIG. 6) similarly includes an encoder 610 with two conversion arrays 612 and 614 and a decoder 630 with two conversion array 632 and 634. Control circuits 616 and 636 decode key values and select the conversion that arrays 612, 614, 632, and 634 perform. In either system 500 or 600, either the encoder or the decoder can be replaced with a single conversion array if the single array is fast enough to perform both conversions performed in the two array system and keep up with the required data rate. Systems including three or more conversion arrays operating sequentially can further improve throughput for conversions involving three or more separate conversions.

Figure 7:
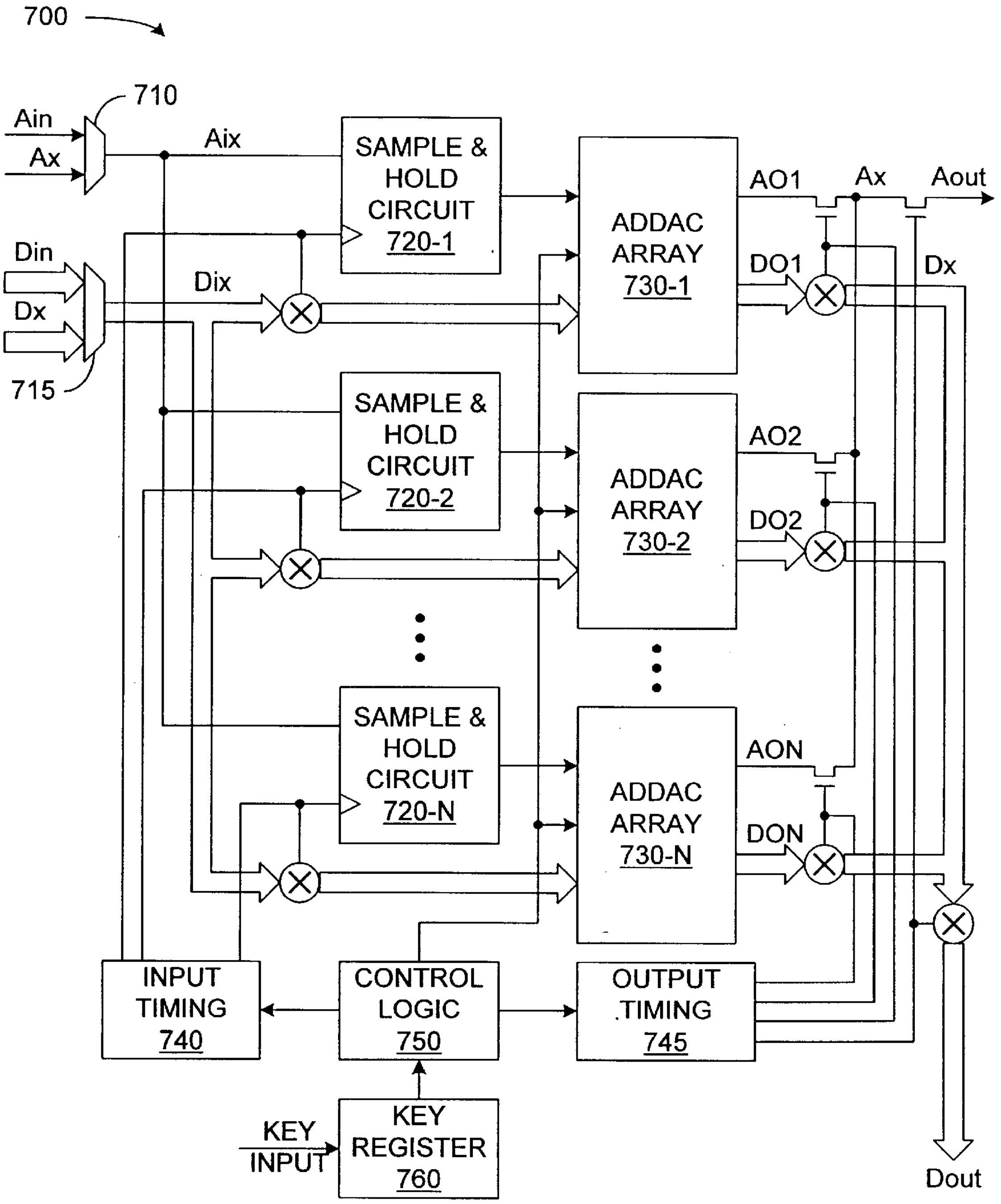
FIG. 7 is a block diagram of an encryption/decryption system using multiple conversion arrays in parallel to increase data throughput.

Operating conversion arrays in parallel can also improve data throughput of a encoding or decoding system. FIG. 7 illustrates a system 700 that uses N conversion arrays 730-1 to 730-N in parallel to encrypt or decrypt an analog input signal Ain or a digital input signal Din. Each array 730-1 to 730-N is an ADDAC capable of selectably performing an analog-to-digital conversion, a digital-to-analog conversion, an analog-to-analog conversion, or a digital-to-digital conversion. For an analog-to-digital or analog-to-analog conversion, multiplexer 710 selects analog input signal Ain or an intermediate signal Ax, and sample-and-hold circuits 720-1 to 720-N sequentially sample the selected signal Aix. Accordingly, arrays 730-1 to 730-N operate in parallel but sequentially begin and complete conversion operations. Timing circuits 740 and 745 select when arrays begin conversion operations and when the output signals AO1 to AON or DO1 to DON from the arrays are used. System 700 performs a digital-to-analog or digital-to-digital conversion in the same manner by sequential starting arrays 720-1 to 720-N and sequentially using the output signals. Multiplexers 710 and 715 can select a new value Ain or Din for conversion or an intermediate value Ax or Dx for encryptions requiring multistep conversions. Control logic 750 decodes a key value from register 760 to select the conversion performed by each array.

Figure 8:
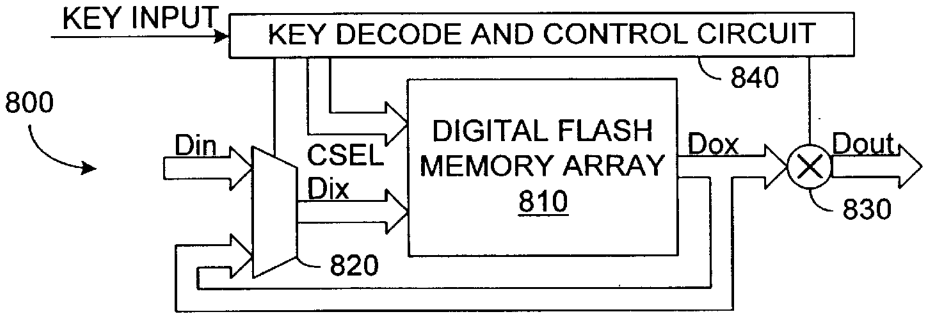
FIG. 8 is a block diagram of a codec including a digital memory array for encryption and decryption of a digital signal.

Although the above systems use conversion arrays typically including memory arrays with analog output signals. Systems including conventional binary memory arrays can also employ aspects of the invention. For example, FIG. 8 illustrates a programmable digital encryption/decryption system 800 that employs a conventional binary flash memory array 810. System 800 implements digital-to-digital conversions using a plurality of look-up tables programmed into array 810. Signal CSEL selects a look-up table for a current conversion, and signal Dix indicates the value to be converted and an address in the selected look-up table. For a conversion of a digital value in signal Din, a multiplexer 820 under the direction of key decode and control circuit 840 initially selects input signal Din as signal Dix, and circuit 840 generates signal CSEL for selecting the first conversion. Array 810 receives input digital signals Dix and CSEL and outputs a digital value Dox read from the location that signals CSEL and Dix identify. If the key indicates only a one step conversion, circuit 840 causes a output circuit 830 (e.g., a latch, flip-flop, or pass gate) to output the current value of signal Dox as for digital output signal Dout. For a multistep conversion, circuit 840 generates signal CSEL to select a look-up table for the next conversion and causes multiplexer 820 to select the value of signal Dox for signal Dix. Array 810 then outputs a new value for signal Dox, the new value being read from the storage location that signals Dix and CSEL then select. The values of signal Dox are looped back through multiplexer 820 to array 810 until the last conversion that the key requires. Output circuit 830 then provides an new value for digital output signal Dout.

Figure 9:
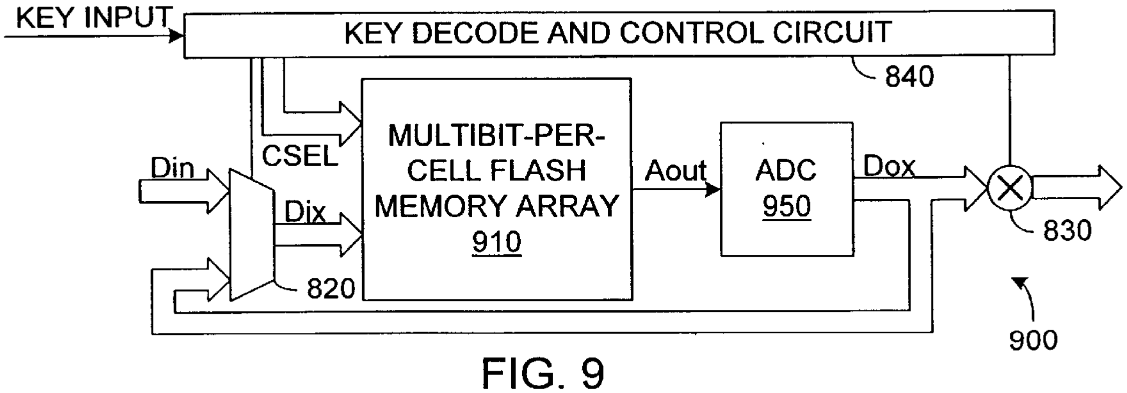
FIG. 9 is a block diagram of a codec including an analog memory array and a linear analog-to-digital converter for encryption and decryption of a digital signal.

FIG. 9 shows a system employing a multibit-per-cell memory array 910 having an analog output coupled to a conventional analog-to-digital converter 950. ADC 950 performs a fixed conversion of an analog signal Aout to a digital signal Dox. The advantage of a multibit-per-cell memory array is that multibit-per-cell memory array requires fewer memory cells than does a binary memory array storing the same information Otherwise system 900 operates in the same manner as system 800.

Although the invention has been described with reference to particular embodiments, the description is only an example of the invention's application and should not be taken as a limitation. Various adaptations and combinations of features of the embodiments disclosed are within the scope of the invention as defined by the following claims.

We claim:

1. A converter comprising:

an array of transistors;

an analog read circuit coupled to the array during a first operation, the analog read circuit having an output terminal for an analog output signal representing a threshold voltage of a transistor identified by a selected digital signal during the first operation;

an input terminal for an analog input signal;

a first select circuit coupled to the array, the output terminal, and the input terminal, wherein the select circuit selects an analog signal, selects a set of transistors in the array, and applies the selected analog signal to gates of transistors in the selected set, and during a second operation, the first select circuit selects one of the analog output signal and the analog input signal as the selected analog signal;

an encoder coupled to the array, wherein the encoder generates a multibit digital output signal that represents a digital output value, the digital output value depending on which of the transistors conduct during the second operation;

an input port for a digital input signal; and a second select circuit that generates the selected digital signal, the selected signal being dependent on one of the digital output signal and the digital input signal during the first operation.

2. The converter of claim 1, wherein the second operation is an analog-to-digital conversion that converts a selected analog value represented by the selected analog signal to a digital output value represented by the digital output signal.

3. The converter of claim 2, wherein the array comprises:

a first set of transistors having a first sequence of threshold voltages that defines a first analog-to-digital conversion; and a second set of transistors having a second sequence of threshold voltages that defines a second analog-to-digital conversion.

4. The converter of claim 3, wherein the first set consists of a first row of transistors in the array, and the second set consists of a second row of transistors in the array.

5. The converter of claim 1, wherein each transistor has a programmable threshold voltage.

6. The converter of claim 5, wherein each transistor is a floating gate transistor.

7. The converter of claim 1, wherein the first operation is a digital-to-analog conversion that converts a selected digital value represented by the selected digital signal to an analog output value represented by the analog output signal.

8. The converter of claim 1, the digital output signal represents how many of the transistors conduct when the selected analog input signal is applied.

* * * * *